United States Patent
Mumford et al.

(10) Patent No.: US 8,252,724 B2
(45) Date of Patent: Aug. 28, 2012

(54) FAULT CURRENT LIMITER WITH A PLURALITY OF SUPERCONDUCTING ELEMENTS HAVING INSULATED, ELECTRICALLY CONDUCTING SUBSTRATES

(75) Inventors: Francis James Mumford, Weston (GB); Alexander Usoskin, Hanau (DE)

(73) Assignees: Areva T & D SAS, Paris la Defense Cedex (FR); Bruker HTS GmbH, Hanau (DE)

( * ) Notice: Subject to any disclaimer, the term of this patent is extended or adjusted under 35 U.S.C. 154(b) by 0 days.

(21) Appl. No.: 12/998,714

(22) PCT Filed: Nov. 25, 2009

(86) PCT No.: PCT/EP2009/008366
§ 371 (c)(1),
(2), (4) Date: Aug. 1, 2011

(87) PCT Pub. No.: WO2010/060597
PCT Pub. Date: Jun. 3, 2010

(65) Prior Publication Data
US 2011/0281735 A1    Nov. 17, 2011

(30) Foreign Application Priority Data
Nov. 29, 2008   (EP) ..................................... 08020789

(51) Int. Cl.
*H01L 39/24* (2006.01)
*H02H 7/00* (2006.01)
*H02H 9/00* (2006.01)

(52) U.S. Cl. ............ 505/237; 505/191; 505/850; 361/19
(58) Field of Classification Search .................. 505/220, 505/236, 237, 850, 231, 191; 361/19, 8, 361/9, 67
See application file for complete search history.

(56) References Cited

U.S. PATENT DOCUMENTS
5,986,536 A * 11/1999 Ries et al. ........................ 338/13
(Continued)

FOREIGN PATENT DOCUMENTS
DE          24 10 148         9/1975
(Continued)

OTHER PUBLICATIONS

Usoskin A. et al. "Superpoli fault-current limiters based on YBCO-coated stainless steel tapes", IEEE Transactions on Applied Superconductivity, vol. 13, No. 2, Jun. 2003, pp. 1972-1975.

*Primary Examiner* — Colleen Dunn
(74) *Attorney, Agent, or Firm* — Paul Vincent

(57) ABSTRACT

A fault current limiter, with a superconducting device (1; 21; 31; 41; 51; 61; 71; 72) comprising a sequence of superconducting elements (2a-2f), each with—a substrate (3a-3d), —a superconducting film (5a-5d), and —an intermediate layer (4a-4c) provided between the substrate and the superconducting film, wherein the superconducting films (5a-5d) of adjacent superconducting elements (2a-2f) of the sequence are electrically connected, in particular in series, is characterized in that the substrates (3a-3d) of the superconducting elements (2a-2d) are electrically conducting substrates (3a-3d), wherein the electrically conducting substrate (3a-3d) of each superconducting element (2a-2f) of the sequence is electrically insulated from each electrically conducting substrate (3a-3d) of those adjacent superconducting elements (2a-2f) within the sequence whose superconducting films (5a-5d) are electrically connected in series with the superconducting film (5a-5d) of said superconducting element (2a-2f), and that the intermediate layers (4a-4c) of the superconducting elements (2a-2f) are electrically insulating layers (4a-4c). The inventive fault current limiter is cost efficient in production, and is capable of a short recovery time after a quench event.

15 Claims, 5 Drawing Sheets

U.S. PATENT DOCUMENTS

| | | | |
|---|---|---|---|
| 6,522,236 B1 * | 2/2003 | Ries | 338/13 |
| 6,765,151 B2 * | 7/2004 | Fritzemeier et al. | 174/125.1 |
| 7,071,148 B1 * | 7/2006 | Selvamanickam et al. | 505/234 |
| 8,150,486 B2 * | 4/2012 | Usoskin | 505/220 |

FOREIGN PATENT DOCUMENTS

| | | |
|---|---|---|
| DE | 101 63 008 | 9/2002 |
| DE | 102 27 840 | 11/2003 |
| JP | 2003 298129 | 10/2003 |

* cited by examiner

FAULT CURRENT LIMITER WITH A PLURALITY OF SUPERCONDUCTING ELEMENTS HAVING INSULATED, ELECTRICALLY CONDUCTING SUBSTRATES

This application is the national stage of PCT/EP2009/008366 filed on Nov. 25, 2009 and also claims Paris Convention priority of EP 08 020 789.7 filed on Nov. 29, 2008.

BACKGROUND OF THE INVENTION

The invention relates to a fault current limiter, with a superconducting device comprising a sequence of superconducting elements, each with an electrically conducting substrate, a superconducting film, and an electrically insulating intermediate layer provided between the substrate and the superconducting film, wherein the superconducting films of adjacent superconducting elements of the sequence are electrically connected, in particular in series, wherein the electrically conducting substrate of each superconducting element of the sequence is electrically insulated from each electrically conducting substrate of those adjacent superconducting elements within the sequence whose superconducting films are electrically connected in series with the superconducting film of said superconducting element, wherein the superconducting films of at least some adjacent superconducting elements are electrically connected by means of a bridge element, wherein the bridge element comprises a superconducting section and wherein the superconducting films of the adjacent superconducting elements electrically connected by means of bridge element are both electrically connected to the superconducting section, and wherein the bridge element overlaps, in particular partially overlaps, with both adjacent superconducting elements electrically connected by means of the bridge element.

Such a superconducting device is known from U.S. Pat. No. 5,986,536.

Superconducting fault current limiters are used to limit the current flow through the load side of an electric circuitry in case of a short circuit on the load side. In the most simple case, the fault current limiter comprises a superconducting device connected in series with the load. The superconducting device can carry a current with very low loss. As long as the current through the superconducting device does not exceed the critical current, the superconducting device is practically invisible within the electric circuitry, and it is the characteristics, in particular the resistance, of the load which determine the current within the electric circuitry.

In case the resistance of the load drops (i.e. there is a short circuit within the load), the current in the circuitry increases, and eventually exceeds the critical current. In this case, the superconducting device quenches (i.e. becomes normally conductive) which results in a high ohmic resistance of the superconducting device. As a result, the current in the electric circuitry drops accordingly, and the load is protected from high electric current.

The superconductor material of a superconducting device must be cooled to a low temperature in order to attain its superconducting state. In order to facilitate and lessen the costs for the cooling, high temperature superconductor materials (HTS materials) may be used. HTS materials have a critical temperature above a temperature of 30 K, and can often be cooled with liquid nitrogen (LN2).

A fault current limiter with a superconducting device using a HTS material is known from U.S. Pat. No. 5,986,536. It comprises several superconducting elements, each comprising a HTS film deposited on an electrically insulating (dielectric) substrate, in particular made of a material that permits textured growth of the HTS film such as yttrium-stabilized $ZrO_2$, with a thin interlayer of Ag. The superconducting elements, i.e. their HTS films, are connected in series.

Fault current limiters of this type comprising superconducting elements with textured superconducting films deposited on a dielectric substrate, are rather expensive to produce. Further, such fault current limiters have a relatively long recovery time after a quench event.

It is the object of the invention to introduce a fault current limiter which is cost efficient in production, and which is capable of a short recovery time after a quench event.

SUMMARY OF THE INVENTION

This object is achieved, in accordance with the invention, by a fault current limiter as introduced In the beginning, characterized in that the bridge element comprises a dielectric substrate, and the superconducting section is a superconducting layer covering the dielectric substrate, and that the superconducting layer of the bridge element faces the superconducting films of the adjacent superconducting elements electrically connected by means of the bridge element.

According to the invention, the fault current limiter (=FCL) is basically superconducting device comprising a plurality of superconducting elements; these superconducting elements each have a superconducting film, in particular a HTS film, deposited on an electrically conducting substrate, in particular a metal substrate. The superconducting film and the electrically conducting substrate are (at least to a very large extend) insulated from each other; for this purpose there is an insulating intermediate layer deposited between the electrically conducting substrate and the superconducting film. It is noted that superconducting wires based on electrically conducting substrates with a HTS material deposited on top are known e.g. from U.S. Pat. No. 6,765,151.

A superconducting element based on an electrically conducting substrate is much more cost efficient in production than a superconducting element based on a dielectric substrate, in particular due to the substrate costs being different by a factor of about 50. Further, an electrically conducting substrate, typically a metal substrate, offers also a much better heat conduction than typical dielectric substrates. As a consequence, after a quench event which typically heats the superconducting element above the critical temperature of the material of the superconducting film, it can be cooled much faster so the fault current limiter recovers normal operation much more rapidly.

As a particularity of the invention, the inventive FCL applies a sequence of superconducting elements, with their superconducting films electrically connected, and with their electrically conducting substrates insulated from each other. This inventive design has been found beneficial for achieving both a high fault resistance, and a sufficiently high possible voltage drop (electrical field) across the direction of current transport, in particular $\geq 2$ V/cm. Allowing to achieve a high fault resistance (i.e. resistance of the fault current limiter in the quenched mode), and allowing to achieve a high voltage drop, can therefore be considered as further objectives of the present invention.

When the inventive FCL is in the fault modus, i.e. when the load has a short circuit and the superconducting films have quenched, the external voltage drops across the fault current limiter, or more exactly across the now resistive (normal-conducting) superconducting films within the fault current limiter.

However, there is a bypass current path, offered by the electrically conducting substrates of the superconducting elements nearby. If the voltage is high enough, it may cause a voltage breakthrough from a superconducting film through an insulating intermediate layer to an electrically conducting substrate.

If a bypass current path through the substrates became active, the fault resistance of the fault current limiter would drop significantly, and the fault current through the FCL would increase, endangering the load to be protected. Moreover, the ohmic heating of the FLC in the fault case would increase, thus prolonging the time required to cool the FCL below the critical temperature of its superconducting films again. The heat dissipation itself can also damage the superconductor material in the FCL, thus limiting the maximum voltage drop across the direction of current transport.

By means of the invention, the electrically conducting substrates of adjacent (neighbouring) superconducting elements connected in series are insulated from each other. As a result, only a part of the external voltage drops across the length of an electrically conducting substrate, basically corresponding to its fraction of the overall length of the superconducting films connected in series in the FCL. So by means of the inventive separation of the electrically conducting substrates, the voltage drop across the length of an electrically conducting substrate can be adjusted, and in particular reduced to a value that safely excludes a voltage breakthrough through the insulating layer. In accordance with the invention, nowhere in the superconducting device there is a potential difference of the total external voltage across the insulating layer, but only of a fraction of the total external voltage, which is not high enough to cause a breakthrough; then a bypass current path through the electrically conducting substrate remains inactive.

Thus in the inventive FCL, whilst in fault mode, the resistance of the superconductor can be kept high and consequently, the Joel's heating kept low.

The latter reduces the recovery time of the FCL after a quench event, and allows a higher voltage drop across the superconductor films without risk of damaging the superconductor material.

It is noted that preferably, in accordance with the invention, the electrically conducting substrate of each superconducting element of the sequence is electrically insulated from each electrically conducting substrate of all superconducting elements within the sequence whose superconducting films are electrically connected in series with the superconducting film of said superconducting element.

In accordance with the invention, the electrically conducting substrate is typically metallic, in particular in the form of a thin tape with a thickness ranging typically between 5 µm and 100 µm. The thin tape may facilitate the cooling of superconducting films, since they have a low heat capacity and have good heat conductivity through the substrate, in particular allowing a highly efficient double-sided cooling of superconducting elements from the top side and through the substrate side.

Electrically connected superconducting films or adjacent superconducting elements are typically connected by a jointing means, wherein the superconducting films have surface area parts which are not covered with a jointing means ("free surface part"). The free surface part may range, in particular, from 10% to 98% of the overall film surface, and typically makes the vast majority of the overall film surface.

It is noted that a superconducting device of an inventive fault current limiter may be supplemented by further superconducting elements of other types than described above; however the latter are not further referred to.

The inventive fault current limiter can be used in an electric circuitry comprising a voltage source, in particular power plant or a power supply network, connected in series with a load, in particular a transformer substation, and connected in series with the inventive fault current limiter. The invention is particularly suited for high voltage sources, with voltages of 1000 V and above, in particular 10 kV and above.

In a preferred embodiment of the inventive fault current limiter, the superconducting films of at least some adjacent superconducting elements are directly electrically connected. A direct electrical connection is simple to realise. Directly electrically connected means in particular that no intermediate superconducting section is involved. Superconductor elements with directly electrically connected superconducting films are further referred to as directly electrically connected superconductor elements.

In a preferred further development of this embodiment, the directly electrically connected adjacent superconducting elements are
- oriented with their superconducting films facing each other, and
- displaced against each other, such that the adjacent superconducting elements partially overlap in an overlap region, wherein in the overlap region, the superconducting films of the overlapping superconducting elements are electrically connected. This arrangement is simple to produce.

Another preferred further development is characterized in that the superconducting films of the directly electrically connected adjacent superconducting elements are electrically connected through a layer of a normally conducting metal. Interconnecting the superconducting films in this way is both simple and highly reliable due to a relatively large contact area, involving only a minimum of interfaces. Typically, the connecting layer exhibits a multilayer structure which comprise transient sub-layers and a central layer.

The sub-layers are formed either directly on the surface of the superconducting film or on the surface of the superconducting film already coated with very thin protection layer of metal. Their task is to provide a low interfacial resistance regarding the superconducting film as well as to ensure a stable mechanical bonding.

These sub-layers are typically made of a precious metals or an alloy of precious metals, in particular comprising gold and/or silver. Alternatively, the sublayers may be based on copper or copper based alloys as Cu—Ag, Cu—Ag—In. Furthermore, each sub-layer may comprise several layers as e.g. a "ground" layer of a precious metal, and a second layer of copper (deposited for example by galvanic plating). Additionally, these several layers may comprise also a final layer made e.g. of Ag or Au or metallic alloys. The task of the final layer is to provide passivation of the surface against chemical reactions in order to improve quality of soldering, and thus to achieve low (e.g. $<10^{-7}$ Ohms×cm$^2$) interfacial resistance within the electrical connection.

The central layer may comprise a solder which allows to provide a cost-efficient connection of the superconducting films, alternatively of the sub-layers deposited onto these films. Typically the solder is a low-melting temperature metal, e.g. In, Zn, Cd, Ga, Bi, Ag or alloys based on such metals. Alternatively, the central layer may be formed as a diffusion layer provided via either cold welding (under pressure) or thermal diffusion (at e.g. 400° C. in case of Ag sub-layers).

According to the invention, the superconducting films of at least some adjacent superconducting elements are electrically connected by means of a bridge element, wherein the bridge element comprises a superconducting section, and wherein the superconducting films of the adjacent superconducting elements electrically connected by means of a bridge element are both electrically connected to the superconducting section. The bridge element and its superconducting section allow more freedom in interconnecting the superconducting films, in particular when the adjacent (neighbouring) superconducting elements with superconducting films connected In series are separated by a significant distance. The resistance between the connected superconducting films during normal operation can thus be kept low. Superconducting elements with superconducting films electrically connected by means of a bridge element are further referred to as superconducting elements electrically connected by means of a bridge element.

In an advantageous further development of this embodiment, the adjacent superconducting elements electrically connected by means of a bridge element are oriented with their superconducting films facing in the same direction, and arranged next to each other, with a gap between two adjacent superconducting elements, wherein the bridge element establishes an electrical connection of the superconducting films of the adjacent superconducting elements across the gap. The gap is a simple way for mutual insulation.

Another preferred further development of the above embodiment is characterized in that the bridge element comprises a dielectric substrate, and the superconducting section is a superconducting layer covering the dielectric substrate, that the superconducting layer of the bridge element faces the superconducting films of the adjacent superconducting elements electrically connected by means of the bridge element, and that the bridge element overlaps, in particular partially overlaps, with both adjacent superconducting elements electrically connected by means of the bridge element. The connections are simple and highly reliable due to a large contact area, with only a minimum of interfaces established.

In a preferred embodiment of the inventive fault current limiter, the superconducting elements are connected in a ring shaped fashion. Such a ring shaped connection has, in case of circular currents, to be considered as a series sequence of the superconducting elements. In particular, only two superconducting elements can be connected in a ring shaped fashion. Preferably, the substrates resp. the superconducting elements as a whole are bent to give a basically circular ring-shaped arrangement. Ring shaped (short-circuited) superconducting devices are used in inductive (transformer-based) fault current limiters, wherein the load is connected in series to the primary side, and the ring-shaped superconducting device is attached at the secondary side of the transformer to shield the secondary side in the normal modus. The inductive FCLs are particularly suitable for limiting AC currents.

In another preferred embodiment, the superconducting elements are connected in a linear sequence. This embodiment is particularly suitable for limiting DC currents, in particular wherein a high external voltage is divided among the superconducting elements of the linear sequence.

A highly preferred embodiment is characterized in that at least one of the superconducting elements comprises an electric contact between its superconducting film and its electrically conducting substrate through its intermediate (insulating) layer, wherein the electrical contact is located basically in the middle between the regions where the superconducting element is electrically connected to a previous and a next superconducting element. By this means, the voltage drop across the insulating intermediate layer can be reduced, namely basically halved. It is noted that the electrical contact should, in the direction of the current flow, only extend over a small distance (as compared to the length of the superconducting element), in order not to offer a bypass current path over a significant length which would reduce the fault resistance.

Alternatively, in another embodiment, within the superconducting elements, the insulating layer is continuous, insulating the superconducting film completely from the electrically conducting substrate. This is very simple to manufacture.

In a particularly preferred embodiment, the fault current limiter is characterized in that the sequence of superconducting elements comprises at least three superconducting elements. In this case, an external voltage can be distributed more broadly. This is especially important in case of FCL of resistive types.

Also within the scope of the present invention is a method for producing a superconducting device for a fault current limiter, in particular an inventive fault current limiter as described above, wherein a sequence of superconducting elements, each with
an electrically conducting substrate,
a superconducting film, and
an electrically insulating layer provided between the electrically conducting substrate and the superconducting film, are electrically connected, in particular electrically connected in series, by establishing an electric connection between the superconducting films of adjacent superconducting elements, but keeping the electrically conducting substrate of each superconducting element of the sequence electrically insulated from the electrically conducting substrates of those adjacent superconducting elements of the sequence whose superconducting films are electrically connected in series with the superconducting film of said superconducting element. The superconducting device can be used as resp. within a fault current limiter, which is cost efficient in manufacturing, offers short recovery times, and can handle high external voltages.

In accordance with the inventive method, each superconducting element is exposed to a voltage applied transversally across the Intermediate layer so current breakthroughs through the Intermediate (insulating) layer are induced, wherein the voltage exposure is carried on until all low resistance bridges through the insulating layer are burnt out. The burning out procedure significantly increases the Insulating performance of the Intermediate layer for the later practical use. Note that the latter step can be performed before or after the superconducting elements have been electrically connected.

In preferred further development of this variant, the voltage is applied as a voltage ramp with a voltage gradually increasing over time, in particular wherein the voltage increases to its maximum value over a time interval of between 0.3 and 15 s. In this way, the low resistance bridges are burned out in sequence, i.e. not simultaneously as an "explosion". This processing is better to control.

Preferably, the processing step in which the superconducting element (resp. its intermediate layer) is exposed to the voltage is performed prior to a processing step in which an electric contact between the superconducting film and the electrically conducting substrate through the intermediate (insulating) layer of said superconducting element is formed. Otherwise, the electrical contact may be damaged by the voltage exposure.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

BRIEF DESCRIPTION OF THE DRAWING

The invention is shown in the drawing.

FIG. 3b shows a schematic plan view of the superconducting device of FIG. 3a;

DESCRIPTION OF THE PREFERRED EMBODIMENT

Figure 4:
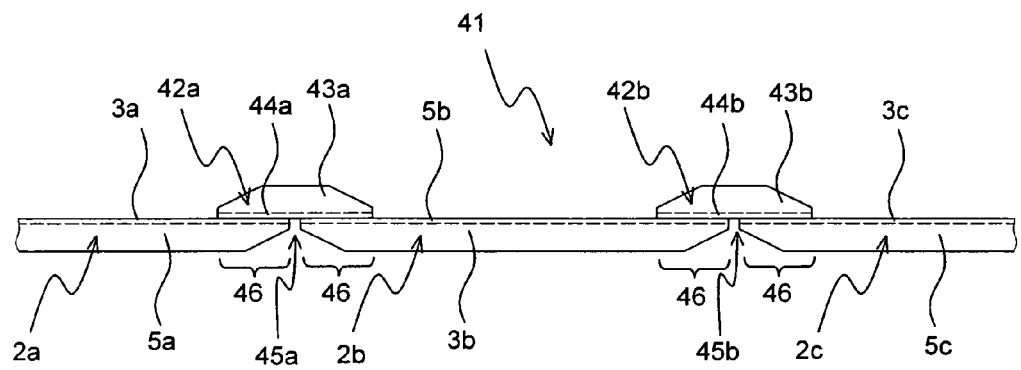
FIG. 4 shows a schematic cross-sectional view of a superconducting device of an inventive fault current limiter, with electrical connection of superconducting films by means of bridge elements.
Figure 5:
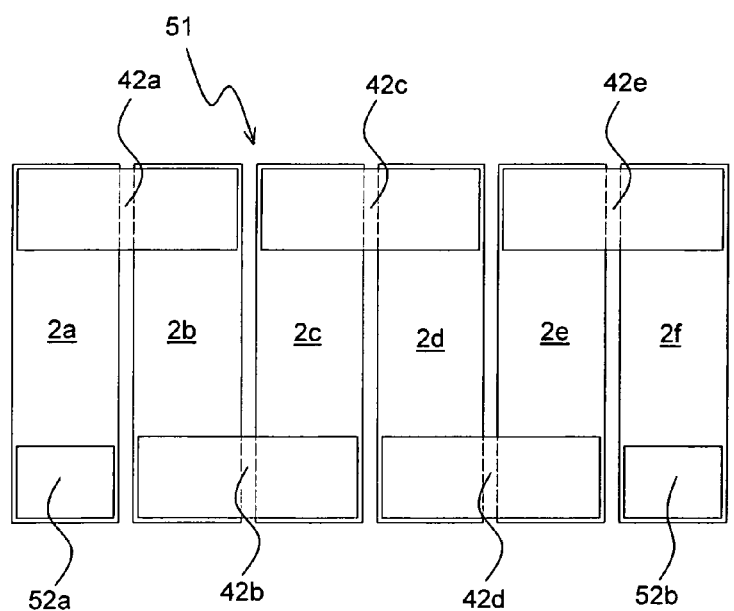
FIG. 5 shows a schematic plan view of a superconducting device for an inventive fault current limiter, with 90° corners between superconducting elements and bridge elements.

In the figures, superconducting devices for use In a fault current limiter, In accordance with the invention, are described. FIGS. 4, 5 and 7b best illustrate the invention, including bridge elements with dielectric substrates.

Figure 1:
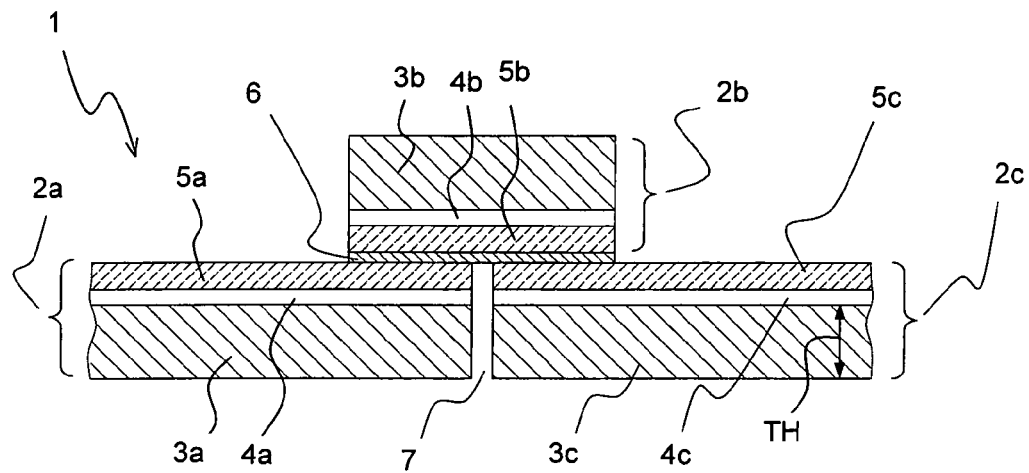
FIG. 1 shows a schematic cross sectional view of a superconducting device of a fault current limiter, with direct electrical connection of the superconducting films with a continuous contacting layer.

FIG. 1 shows a superconducting device 1, with a sequence of three superconducting elements 2a, 2b, 2c shown in FIG. 1. Each superconducting element 2a, 2b, 2c comprises an electrically conducting substrate 3a, 3b, 3c, which is preferably made of a sheet metal tape, an intermediate layer, i.e. insulating (dielectric) layer 4a, 4b, 4c, and a superconducting film 5a, 5b, 5c, preferably a HTS superconducting film, and most preferably an $YBa_2C_{u3}O_{7-x}$ film. The substrate thickness TH is typically about 5 μm to 100 μm.

In a concrete example, the substrates 3a, 3b, 3c are based on CrNi stainless steel, 0.1 mm thick, 10 mm wide and 200 mm long. More generally, the length of the superconducting elements (measured in the direction of current flow) may vary from millimeter to several meter size; in our tests, from 20 to 2000 mm have been used, depending on the voltage drop per unit length in quenched elements (voltage drops from 0.3 to 4 V/cm were considered in the example), and on thickness and quality of the intermediate (insulation) layer.

The intermediate layer comprising yttria stabilized zirconia layer is from 1 to 5 μm thick in the given example. The thickness of the $YBa_2C_{u3}O_{7-x}$ film is 1.2 μm. The superconducting elements yielded a critical current of 320 A at −196° C.

The superconducting film 5a of the left superconducting element 2a is electrically connected to the superconducting film 5b of superconducting element 2b, which is the next superconducting element in the series connection of the superconducting elements 2a-2c of the superconducting device 1. The superconducting film 5b of superconducting element 2a, in turn, is electrically connected to the superconducting film 5c of the superconducting element 2c, which is again the next superconducting element connected in series. The electrical connection is established by means of a continuous connecting layer 6 deposited on top of the central superconducting element 2b. The connection layer typically comprises a multilayer structure which in turn comprises transient sub-layers and a central layer.

The sub-layers are formed on the surface of the superconducting film already coated with a very thin (0.07 μm) protection layer of a precious metal as Ag or Au. In the present particular example, these sub-layers comprise also a second layer of Cu, 1 μm thick, deposited via galvanic plating. The sub-layers are provided only within the surface area devoted for the connection, i.e. the rest surface of the superconducting elements are kept free from any sub-fraction of the connection layer.

The central layer is provided via solder comprising one or more metals from group of In, Sn, Zn, In, Cd, Bi or their combinations. The melting temperature of the solder was from 100 to 200° C. The thickness of the central layer in the considered example may vary between 2 and 30 μm. The entire interfacial resistance of the connection layer provided in this example is below $5 \times 10^{-7}$ Ohms×cm$^2$ measured at −196° C., i.e. at boiling temperature of liquid nitrogen.

The superconducting elements 2a, 2c are aligned in parallel, and the superconducting element 2b is oriented opposite thereto, such that its superconducting film 5b faces the superconducting films 5a, 5c. Between the superconducting elements 2a and 2c, there is a gap 7, which means that also the electrically conductive substrates 3a and 3b are electrically insulated from each other. Accordingly, here the electrically conducting substrates 3a, 3b, 3c of all superconducting elements 2a, 2b, 2c of the sequence of the superconducting device 1 are electrically insulated against each other, what is generally preferred within the invention.

The gap 7 may be also filled with additional insulator (as e.g. epoxy resin or Teflon) in order to confine spreading of the metallic solder of the connection layer within the gap and thus to avoid possibility of short-circuiting of the electrically conducting substrates 3a and 3c.

Moreover, in order to achieve an improved degree of insulation between the substrate and the superconducting film, each superconducting element is pre-treated via exposing to a voltage applied transversally across the intermediate layer so current breakthroughs through the electrically insulating layer are induced, wherein the voltage exposure is carried on until all low resistance bridges through the insulating layer are burnt out. A dc voltage that may vary from 10 to 200V is applied between the superconducting film and the electrically conducting substrate. The voltage is linearly ramped in a way that the maximal voltage is reached within 1-5 seconds; the maximal voltage value is determined prior to the treatment as about 80% of the breakthrough voltage measured in an electrically insulating layer of the same type but with homogeneous structure, i.e. without low resistance bridges. All procedures regarding such pre-treatments are preferably performed at room temperature conditions. By cooling down of the superconducting elements the maximal breakthrough voltage typically grows.

The superconducting device is, during operation, cooled e.g. with liquid nitrogen (LN2), preferably from both sides (bottom and top), so that each superconducting element is cooled directly from the side of the superconducting film, and through the substrate (the cooling means are not shown).

In the further superconducting devices revealed in the following FIG. 2 through FIG. 7, corresponding features and procedures, in particular with respect to voltage pre-treatment, cooling means, and insulating gap fillings, may be applied unless otherwise described.

Figure 2:
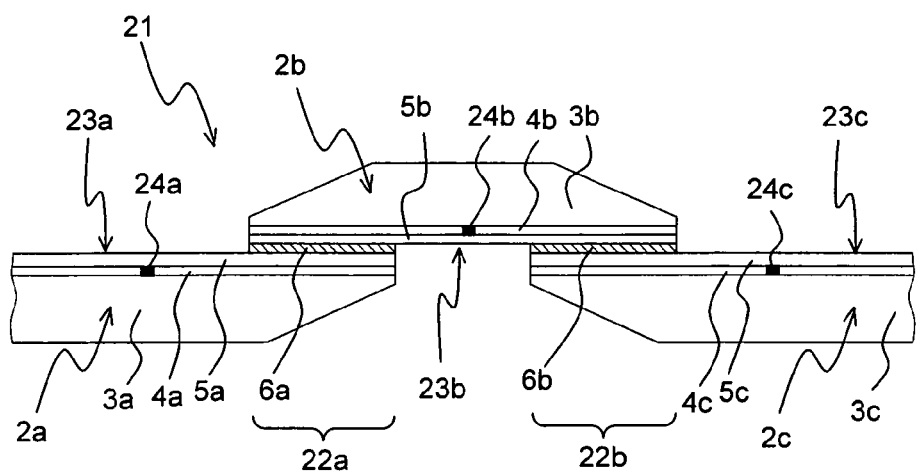
FIG. 2 shows a schematic cross-sectional view of a superconducting device of a fault current limiter, with direct electrical connection of the superconducting films with local contacting layers at the interfaces.

FIG. 2 shows a superconducting device 21 similar to the superconducting device shown in FIG. 1. Here, the superconducting films 5a, 5b are connected by a connecting layer part 6a, and the superconducting films 5b, 5c are connected connecting layer part 6b. The connecting layer parts 6a, 6b are separate and therefore electrically insulated from each other, and are made of a normally conducting metal, in particular gold or silver. The connecting layer parts 6a, 6b, accordingly, extend only in the overlap regions 22a, 22b of the superconducting elements 2a, 2b, 2c. The surface area parts 23a, 23b, 23c, which are free from jointing means (here free from electrically conductive connection layer parts) help to increase the resistance of the superconducting device 21 under the fault current. This follows from the fact that the quench forms preferably at the portions of the superconducting elements which are not "bypassed" by another superconducting element or bridge element.

In particular, in the superconducting device 21 of FIG. 2, the insulating layers 4a, 4b, 4c have central electric contact 24a, 24b, 24c, to limit the voltage drop across the insulating layers 4a-4c.

It is noted that on top of the superconducting films 5a-5c, there may be deposited a very thin cover layer (or protection layer) of a conducting metal, in particular noble metal such as silver or gold. However, the thickness of this cover layer should be small enough so that no significant current bypass with respect to the underlying superconducting film is established. Preferably, though, no cover layer is used.

Figure 3A:
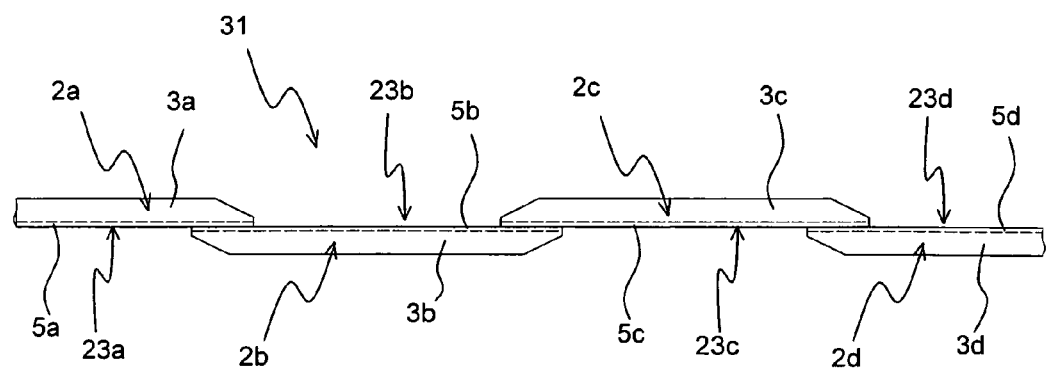
FIG. 3a shows a schematic cross-sectional view of a superconducting device of a fault current limiter, with direct electrical connection of the superconducting films, with extended free surface areas of the superconducting films.
Figure 3B:
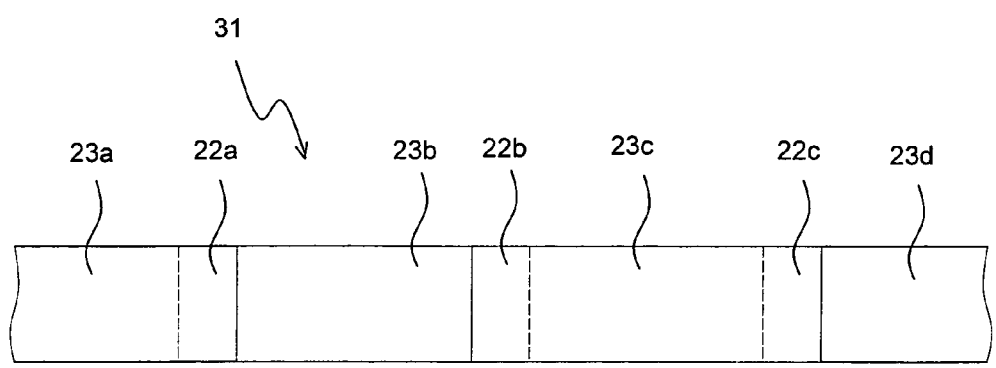

FIG. 3a and FIG. 3b show a superconducting device 31, with a sequence of four superconducting elements 2a-2d electrically connected in series, in cross-section (FIG. 3a) and top view (FIG. 3b). The superconducting elements 2a-2d have an alternating orientation, with adjacent superconducting elements with their superconducting films 5a-5d facing each other (note that the insulating layers are not shown here, for simplification). In the top view of FIG. 3b, the overlap regions 22a, 22b, 22c can be well recognized. They make about 20% of the overall superconducting films' surface, with the other 80% belonging to free surface parts 23a-23d.

FIG. 4 shows an alternative design for a superconducting device 41, here showing a sequence of three superconducting elements 2a, 2b, 2c, with superconducting films 5a, 5b, 5c each (again, the intermediate insulating layers are not shown for simplicity). The superconducting elements 2a-2c are all oriented identically with their superconducting films facing to the same side (here: top side), and are separated by gaps 45a, 45b.

The superconducting films 5a-5c are pair-wise electrically connected in series by bridge elements 42a, 42b, each comprising a dielectric (electrically insulating) substrate 43a, 43b, and a superconducting layer 44a, 44b, preferably a high temperature superconducting (HTS) film layer. The bridge elements 42a, 42b overlap with the superconducting elements (resp. superconducting films 5a-5c) they connect, compare overlap regions 46. In this particular example, the dielectric substrates 43a, 43b are made of either yttria-stabilized-zirconia ceramics or sapphire (single crystalline $Al_2O_3$).

FIG. 5 shows a top view of a superconducting device 51, to be used in a fault current limiter in accordance with the invention. There is a sequence of six straight superconducting elements 2a-2f oriented in parallel, all with their superconducting films face up. By means of five bridge elements 42a-42e attached on top, the superconducting elements 2a-2f (resp. their superconducting films) are electrically connected in series. The bride elements 42a-42e are oriented perpendicular to the superconducting elements 2a-2f in order to make the superconductive device 51 more compact. At the beginning and the end of the superconducting device 51 (resp. the sequence of superconducting elements 2a-2f), there are two metal pads 52a, 52b, in particular Cu pads, for external joints, which are galvanically deposited on the superconducting elements 2a and 2f.

Figure 6:
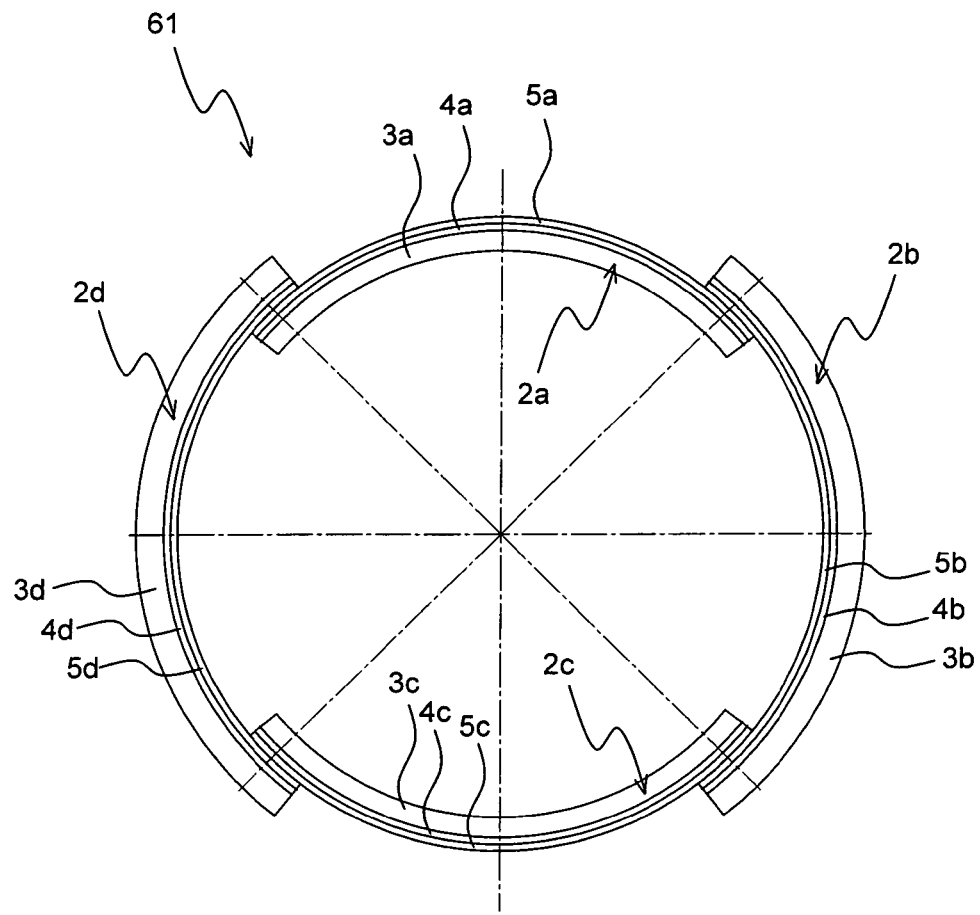
FIG. 6 shows a schematic cross-sectional view of a ring-shaped superconducting device for a fault current limiter, with four superconducting elements directly connected.

FIG. 1 through FIG. 5 have shown linear sequences of superconducting elements. FIG. 5 through FIG. 6b show ring shaped superconducting devices, in particular for use in inductive (transformator-based) fault current limiters.

FIG. 6 shows a superconducting device 61 with ring shaped arranged superconducting elements 2a, 2b, 2c, 2d. Each has an electrically conducting substrate 3a-3d, and intermediate insulating layer 4a-4d, and a superconducting film 5a-5d. Every superconducting element 2a-2d is directly electrically connected to its previous and its following adjacent superconducting element 2a-2d, with the electrical connection established only between the superconducting films 5a-5d, but not between the electrically conducting substrates 3a-3d. The electrically conducting substrates 3a-3d of the ring are all electrically insulated from each other. The superconducting elements 2a-2d are generally bent as a circular arc.

Figure 7A:
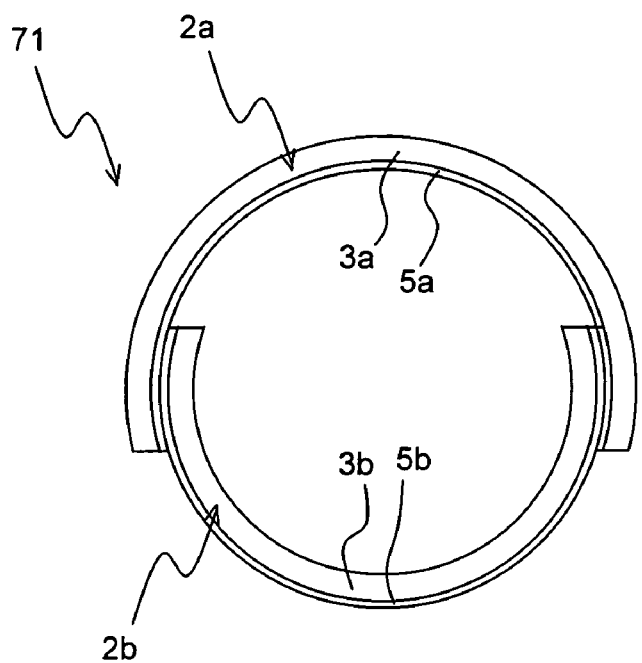
FIG. 7a shows a schematic cross-sectional view of a ring-shaped superconducting device of a fault current limiter, with two superconducting elements directly connected.
Figure 7B:
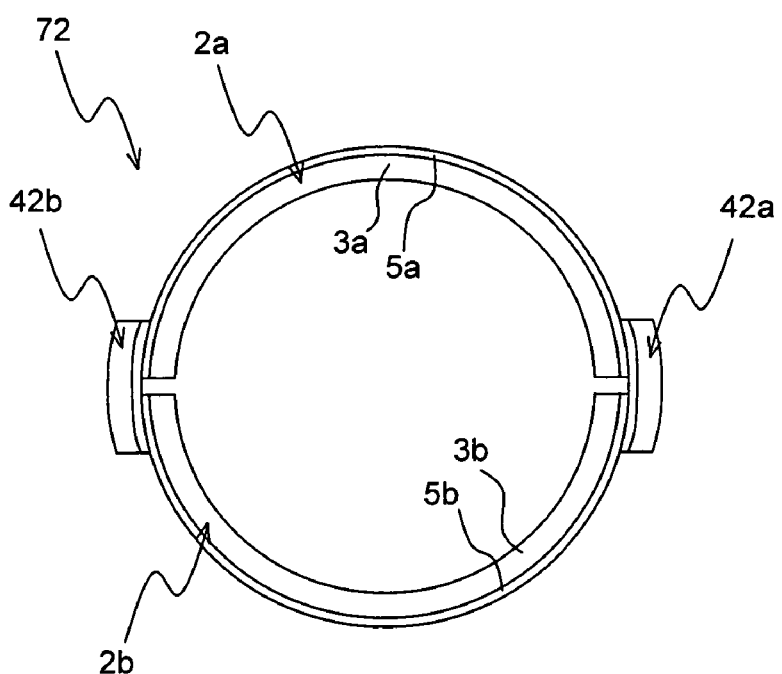
FIG. 7b shows a schematic cross-sectional view of a ring shaped superconducting device of an inventive fault current limiter, with two superconducting elements connected via bridge elements.

FIG. 7a shows a superconducting device 71 for a fault current limiter similar to the one shown in FIG. 5, but comprising only superconducting elements 2a, 2b, with direct electrical connection of their superconducting films 5a, 5b. Note that the intermediate insulating layers are not shown for simplicity.

FIG. 7b shows a superconducting device 72, comprising two superconducting elements 2a, 2b, with their superconducting films 5a, 5b electrically connected via bridge elements 42a, 42b. Again, the intermediate insulating layers are not shown for simplicity.

We claim:

1. A fault current limiter with a superconducting device, the fault current limiter comprising:
a sequence of superconducting elements, each superconducting element having an electrically conducting substrate, a superconducting film, and an electrically Insulating intermediate layer disposed between said substrate and said superconducting film, wherein superconducting films of adjacent superconducting elements of said sequence are electrically connected, said electrically conducting substrate of each superconducting element of said sequence being electrically insulated from each electrically conducting substrate of adjacent superconducting elements within said sequence whose superconducting films are electrically connected in series with said superconducting film of said superconducting element; and at least one bridge element disposed between and electrically connecting superconducting films of at least some adjacent superconducting elements, said bridge element having a superconducting section, wherein superconducting films of adjacent superconducting elements electrically connected by means of said bridge element are electrically connected to said superconducting section, said bridge element overlapping both adjacent superconducting elements electrically connected by means of said bridge element, said bridge element comprising a dielectric substrate, wherein said superconducting section is a superconducting layer covering said dielectric substrate and said superconducting layer of said bridge element faces superconducting films of adjacent superconducting elements electrically connected by means of said bridge element.

2. The fault current limiter of claim 1, wherein superconducting films of adjacent superconducting elements of said sequence are electrically connected in series.

3. The fault current limiter of claim 1, wherein superconducting films of some adjacent superconducting elements are directly electrically connected.

4. The fault current limiter of claim 3, wherein directly electrically connected adjacent superconducting elements are oriented with superconducting films thereof facing each other, and are displaced with respect to each other such that adjacent superconducting elements partially overlap in an overlap region, superconducting films of overlapping superconducting elements being electrically connected in said overlap region.

5. The fault current limiter of claim 3, wherein superconducting films of directly electrically connected, adjacent superconducting elements are electrically connected through a layer of normally conducting metal.

6. The fault current limiter of claim 1, wherein adjacent superconducting elements electrically connected by means of said bridge element are oriented with superconducting films thereof facing in a same direction and are arranged next to each other, with a gap being formed between two adjacent superconducting elements, wherein said bridge element establishes electrical connection across said gap between superconducting films of adjacent superconducting elements.

7. The fault current limiter of claim 1, wherein said superconducting elements are connected in a ring shaped fashion.

8. The fault current limiter of claim 1, wherein said superconducting elements are connected in a linear sequence.

9. The fault current limiter of claim 1, wherein at least one of said superconducting elements comprises an electric contact between said superconducting film thereof and a respective said electrically conducting substrate through a respective said insulating layer, said electrical contact being located substantially in a middle, between regions where said superconducting element is electrically connected to a previous and to a following superconducting element.

10. The fault current limiter of claim 1, wherein, within said superconducting elements, said insulating layer is continuous, thereby completely insulating said superconducting film from said electrically conducting substrate.

11. The fault current limiter of claim 1, wherein said sequence of superconducting elements comprises at least three superconducting elements.

12. A method for producing a superconducting device for a fault current limiter, the method comprising the steps of:
   a) electrically connecting a sequence of superconducting elements, each superconducting element having an electrically conducting substrate, a superconducting film and an electrically insulating layer disposed between the electrically conducting substrate and the superconducting film, wherein electric connection is established between the superconducting films of adjacent superconducting elements while keeping the electrically conducting substrate of each superconducting element of the sequence electrically insulated from electrically conducting substrates of adjacent superconducting elements of the sequence whose superconducting films are electrically connected in series to the superconducting film of the superconducting element; and
   b) exposing each superconducting element to a voltage applied transversally across the electrically insulating layer to induce current breakthroughs through the insulating layer, wherein voltage exposure is continued until all low resistance bridges through the insulating layer are burnt out.

13. The method of claim 12, wherein the sequence of superconducting elements are electrically connected in series.

14. The method according to claim 12, wherein the voltage is applied as a voltage ramp with a voltage gradually increasing over time.

15. The method of claim 14, wherein the voltage increases to a maximum value thereof over a time interval of between 0.3 s and 15 s.

* * * * *